(12) United States Patent
Previtali et al.

(10) Patent No.: US 9,721,850 B2
(45) Date of Patent: Aug. 1, 2017

(54) METHOD FOR MAKING A THREE DIMENSIONAL INTEGRATED ELECTRONIC CIRCUIT

(71) Applicant: Commissariat a l'energie atomique et aux energies alternatives, Paris (FR)

(72) Inventors: Bernard Previtali, Grenoble (FR); Maud Vinet, Claix (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/993,598

(22) Filed: Jan. 12, 2016

(65) Prior Publication Data

US 2016/0211184 A1    Jul. 21, 2016

(30) Foreign Application Priority Data

Jan. 16, 2015 (FR) ..................... 15 50335

(51) Int. Cl.
*H01L 21/84* (2006.01)
*H01L 27/06* (2006.01)
(Continued)

(52) U.S. Cl.
CPC ........ *H01L 21/84* (2013.01); *H01L 21/76895* (2013.01); *H01L 21/823871* (2013.01);
(Continued)

(58) Field of Classification Search
CPC .............. H01L 21/486; H01L 21/6835; H01L 21/8221; H01L 2224/97; H01L 2924/1517;
(Continued)

(56) References Cited

U.S. PATENT DOCUMENTS

| 4,472,729 A | 9/1984 | Shibata et al. |
| 6,624,046 B1 | 9/2003 | Zavracky et al. |

(Continued)

FOREIGN PATENT DOCUMENTS

| EP | 2 575 162 A2 | 4/2013 |
| FR | 2 896 620 A1 | 7/2007 |
| FR | 2 979 481 A1 | 3/2013 |

OTHER PUBLICATIONS

French Preliminary Search Report issued Nov. 5, 2015 in French Application 15 50335 filed on Jan. 16, 2015 (with English Translation of Categories of Cited Documents).

(Continued)

*Primary Examiner* — Amar Movva
(74) *Attorney, Agent, or Firm* — Oblon, McClelland, Maier & Neustadt, L.L.P.

(57) ABSTRACT

A method for making a three-dimensional integrated electronic circuit is provided, including making a first electrically conductive portion on a first dielectric layer covering a first semiconductor layer; then making a second dielectric layer covering the first electrically conductive portion such that it is disposed between the first and second dielectric layers, and a second semiconductor layer disposed on the second dielectric layer; then making a first electronic component in the second semiconductor layer, and a second electronic component in the first semiconductor layer; then making an electrical interconnection electrically linking the first and second electronic components together, of which a first part passes through the first dielectric layer and electrically connects the second electronic component to the first electrically conductive portion and of which a second part passes through a part of the second dielectric layer and electrically connects the first electronic component to the first electrically conductive portion.

13 Claims, 6 Drawing Sheets

(51) Int. Cl.
*H01L 21/8238* (2006.01)
*H01L 27/02* (2006.01)
*H01L 21/768* (2006.01)
*H01L 23/485* (2006.01)
*H01L 23/528* (2006.01)
*H01L 23/535* (2006.01)
*H01L 21/822* (2006.01)

(52) U.S. Cl.
CPC ........ *H01L 23/485* (2013.01); *H01L 23/5286* (2013.01); *H01L 23/535* (2013.01); *H01L 27/0251* (2013.01); *H01L 27/0694* (2013.01); *H01L 21/8221* (2013.01)

(58) Field of Classification Search
CPC ........... H01L 23/49827; H01L 23/5389; H01L 25/162; H01L 23/485; H01L 23/5286; H01L 23/535; H01L 27/0694
See application file for complete search history.

(56) References Cited

U.S. PATENT DOCUMENTS

| | | |
|---|---|---|
| 8,906,755 B1 | 12/2014 | Hekmatshoartabari et al. |
| 2003/0129829 A1 | 7/2003 | Greenlaw |
| 2007/0170471 A1 | 7/2007 | Joly et al. |
| 2007/0267723 A1 | 11/2007 | Bernstein et al. |
| 2008/0054359 A1 | 3/2008 | Yang et al. |
| 2009/0020817 A1 | 1/2009 | Park et al. |
| 2009/0294984 A1 | 12/2009 | Zhu |
| 2010/0187607 A1* | 7/2010 | Dennard .......... H01L 21/76254 257/347 |
| 2013/0052805 A1 | 2/2013 | Previtali |
| 2015/0044841 A1 | 2/2015 | Batude et al. |
| 2015/0056734 A1 | 2/2015 | Grenouillet et al. |
| 2015/0294903 A1 | 10/2015 | Grenouillet et al. |
| 2015/0294904 A1 | 10/2015 | Vinet et al. |
| 2015/0340275 A1 | 11/2015 | Vinet et al. |

OTHER PUBLICATIONS

T. Irisawa, et al., "Demonstration of Ultimate CMOS based on 3D Stacked InGaAs—OI/SGOI Wire Channel MOSFETs with Independent Back Gate", Energy Efficiency Convention (SAEEC), IEEE, 2012, 2 pgs.

M. Vinet, et al., "Monolithic 3D Integration: a powerful alternative to classical 2D Scaling", SOI-3D Subthreshold Microelectronics Technology Unified Conference (S3S), IEEE, 2014, 3 pgs.

U.S. Appl. No. 14/782,190, filed Oct. 2, 2015, Maud Vinet, et al.

* cited by examiner

METHOD FOR MAKING A THREE DIMENSIONAL INTEGRATED ELECTRONIC CIRCUIT

TECHNICAL FIELD AND PRIOR ART

The invention concerns the field of three-dimensional electronic circuits comprising electronic components which correspond, for example, to CMOS transistors of different conductivities.

In comparison with a conventional integrated electronic circuit made from a single semiconductor layer, a three-dimensional integrated electronic circuit comprises several levels of electronic components, such as MOS transistors, superposed one on top of the other. One of the advantages of three-dimensional integration of integrated electronic circuits is the increase in the integration density of electronic components in these three-dimensional integrated electronic circuits in comparison with conventional integrated electronic circuits, which allows a reduction in the mean propagation times in the electrical interconnections of these circuits linked to electronic components to be achieved.

Currently there exist two families of three-dimensional integration of integrated electronic circuits.

The first, called parallel integration, involves making the electronic components of an integrated electronic circuit in parallel and separately on several substrates or wafers until they are complete, then bonding the substrates one on top of the other and then finally making common electrical interconnections to electrically connect together the electrical components made on the various substrates. The bonding between these substrates may be achieved after silicidation of the electrical contacts of the electronic components, or after the making of the first level of metallisations on each of the substrates.

Document U.S. Pat. No. 6,624,046 B1 describes an example of parallel integration comprising the making of a three-dimensional integrated circuit from several circuits manufactured separately from different substrates, where the circuits are then stacked and interconnected together by vertical electrical interconnections. Each new circuit layer is transferred onto the stack of circuits made and holes are made through this new circuit layer facing the electrical contact zones previously defined on the stack. An electrically conductive material is then deposited into these holes in order to make electrical interconnections between this new circuit layer and the remainder of the stack.

In such a parallel integration, a second substrate which comprises electronic components made by several levels of lithography is transferred onto a first substrate also comprising electronic components made using several levels of lithography. The step for bonding of the two substrates must be carried out whilst aligning these two substrates in relation to each other so that the patterns (electronic components, electrical contact zones etc.) defined on the second substrate are suitably positioned in relation to the patterns defined on the first substrate. Currently the level of performance for alignment during such bonding is limited to a few microns, thus excluding the possibility of using this method to make, for example, local electrical interconnections in dense zones of the circuit. The expression "local electrical interconnection" designates an electrical interconnection between two neighbouring electrical components (arranged facing each other or beside each other), for example two neighbouring transistors.

With such parallel integration the tolerances for alignment of the substrates in relation to each other that are encountered during the bonding therefore limit the integration density of the electrical components which may be obtained in three-dimensional electronic circuits thus made.

The second family, known as sequential integration, overcomes the alignment problems encountered in parallel integration. During sequential integration the various levels of electronic components are made one after the other. A first level of electronic component is, for example, obtained in a conventional manner, via the making of electronic components of the first level on a first substrate, for example of the SOI (silicon on insulator) type or "bulk" type. For the making of electronic components of a second level, a layer of semiconductor material is either transferred onto the first substrate on which the electronic components of the first level have been made, as described in document FR 2 896 620 or in document US 2008/0054359 A1, or made by epitaxial growth or a recrystallised polycrystalline deposit, of semiconductor through the openings made in a dielectric material protecting the electronic components of the first level, allowing the crystalline orientation of the semiconductor of the first level to be re-made, as described in documents U.S. Pat. No. 4,472,729 and US 2009/0020817 A1.

Document FR 2 896 620 describes an example of sequential integration in which an assembly of PMOS transistors on NMOS transistors is made by transferring a layer of germanium onto a planarised dielectric material covering the NMOS transistors which are made in a silicon substrate. The PMOS transistors are then made in the layer of germanium. The thickness of dielectric material to be etched during the making of the electrical contacts is about twice as great for the lower level as for the upper level. This may result in degradation of the zones in the upper level intended to make electrical contact (in the case of over-etching) or result in insufficient etching during the making of the electrical contacts of the electronic components of the lower level. In order to remedy this it is possible to make electrical contact points for the various levels in several steps. This however has the drawback of increasing the cost of manufacturing them. Furthermore, the bonding interface is located between the two levels of electronic components, which limits the possible hydrofluoric acid-based cleaning that must be carried out during the manufacture of the transistors (before deposition of the gate insulation, after etching of the gate, after the etching of the spacer or spacers, before epitaxy of the source and drain, and before silicidation of the source and drain) due to the risk of total or partial de-bonding of the assembled levels of electronic components, with these cleaning operations being necessary for proper manufacture and proper operation of the transistors.

Furthermore, during sequential integration as described above, it is not possible to integrate local electrical interconnections between the different levels of electronic components because of the thermal budgets involved during the making of the upper levels of electronic components (for example during epitaxial growth of source and drain regions of the transistors of the upper level, which necessarily imply heat budgets greater than about 400° C.). This results in an increased resistance of the silicides (transformation of NiSi into $NiSi_2$) and the destruction of the interconnections due to fusion. Problems of contamination of the electrical interconnections connected to the transistors of the lower level may also occur during bonding of the semiconductor layer of the upper level. Finally, the making of the upper levels of electronic components must also be undertaken with a low thermal budget in order not to damage the electronic components of the lower level.

Document FR 2 979 481 describes a method for making a three-dimensional integrated electronic circuit implemented using a three-layer Si/SiGe/Si stack made using epitaxy. The two silicon layers make up the active zones of the MOS transistors of the two levels of the circuit. The SiGe layer is etched to then form an insulating zone between the transistors of the two levels. The drawback of such a method is that the distance between the two levels of transistors is dictated by the initial thickness of SiGe. To avoid the dislocations occurring, the maximum thickness of SiGe is necessarily limited to about 100 nm or 150 nm. Such a thickness does not allow elements to be arranged between the two levels of transistors, such as for example ground planes, local electrical interconnections and or a thermal and electrostatic screen.

Furthermore, these parallel or sequential integrations of several levels of electronic components also come up against the problem of congestion of the metallisation levels which are made on one side of the integrated circuit, which limits the density with which the electronic components may be made.

DESCRIPTION OF THE INVENTION

Thus there is a need to offer a method for making a three-dimensional integrated electronic circuit which does not exhibit the drawbacks of the methods of the prior art, that is:

which does not exhibit the alignment problems encountered during parallel integration, which does not pose the problem of over-etching or insufficient etching during the making of electrical contacts for the electronic components, which does not exhibit the problem of contamination of the electrical interconnections, which does not damage electronic components as a result of the thermal budgets that are successively used during the process, which allows elements to be arranged between two levels of electronic components in the circuit, such as for example, ground planes, local electrical interconnections and or a thermal and electrostatic screen.

which allows metallisation levels to be made on the sides or principal faces of the circuit.

To this end, it is disclosed a method for making a three-dimensional integrated electronic circuit comprising at least the following steps:

making at least one first portion of electrically conductive material on at least one first dielectric layer covering at least one first semiconductor layer;

making at least one first electronic component in at least one second semiconductor layer arranged on at least one second dielectric layer covering at least the first portion of electrically conductive material, and of at least one second electronic component in the first semiconductor layer;

making at least one electrical interconnection electrically linking the first and second electronic components together, of which a first part passes through at least the first dielectric layer and electrically connects the second electronic component to the first portion of electrically conductive material and of which a second part passes through at least one part of the second dielectric layer and electrically connects the first electronic component to the first portion of the electrically conductive material.

It is also proposed a method for making a three-dimensional integrated electronic circuit comprising at least the following steps:

making at least one first portion of electrically conductive material on at least one first dielectric layer covering at least one first semiconductor layer; then making at least one second dielectric layer covering at least the first portion of electrically conductive material such that the first portion of electrically conductive material is arranged between the first and second dielectric layers, and at least one second semiconductor layer arranged on the second dielectric layer; then making at least one first electronic component in the second semiconductor layer, and at least one second electronic component in the first semiconductor layer; then making at least one electrical interconnection electrically linking the first and second electronic components together, of which a first part passes through at least the first dielectric layer and electrically connects the second electronic component to the first portion of electrically conductive material and of which a second part passes through at least one part of the second dielectric layer and electrically connects the first electronic component to the first portion of electrically conductive material.

In this method, the step of making the first portion of electrically conductive material is carried out before the step of making the second dielectric layer and the second semiconductor layer. The step of making the second dielectric layer and the second semiconductor layer is carried out before the step of making the first and second electronic components. Moreover, the step of making the first and second electronic components is carried out before the step of making the electrical interconnection.

In this method the first and second electronic components are made sequentially, which allows the method to overcome the alignment problems encountered in parallel integration.

The first and second electronic components are electrically connected to each other using the local electrical interconnection formed between them. Because this electrical interconnection is made up of two parts each of which extend from one of the electronic components to the portion of electrically conductive material made prior to the electronic components, no problems of over-etching or insufficient etching are encountered during the implementation of this method.

Furthermore, due to the fact that the electrical interconnection is made after making the first and second electronic components, there is no contamination problem encountered in particular when an electronic component of an upper level is made in the presence of an electrical interconnection already present in the lower level.

This method also has the advantage of not mixing thermal budgets. In this method the so-called "Front-end" steps involving significant thermal budgets (for example of around 1000° C. or more) are first of all implemented (corresponding for example to the steps running from the start of the method to the end of the epitaxy steps), then the so-called "Middle-end" steps (silicidation, tungsten deposition etc.) involving intermediate thermal budgets (for example up to temperatures of about 500° C.) and so-called "Back-end" steps (copper deposition etc.) involving lower thermal budgets (temperatures lower than about 400° C.) are implemented at the end of the method.

This method also has the advantage of allowing metallisation levels to be made on each main face or each side of the circuit, thus extending the limits associated with the congestion of the levels of metallisation on a single side of integrated circuits of the prior art, and therefore increases the density of electronic components that can be made in the integrated electronic circuit.

This method also allows ground planes to be arranged between the electronic components, where these ground planes, when they are coupled to the electronic components which correspond to MOS transistors, in particular allow the threshold voltage of these transistors to be adjusted.

One or more levels of lines of local electrical interconnections may be arranged between the two levels of electronic components, which in particular allows any problems of alignment of through-contacts to be overcome (due to the fact that the electrical interconnections may be made in two parts, each being in contact with one level of lines of electrical interconnections), and also offer the possibility of connecting the first and second electronic components together without necessarily passing through the metallisation levels (so-called "back-end" levels) made on the sides of the circuit, above the electronic components.

This method also allows one or more thermal and electrostatic screens to be arranged between the two levels of electronic components.

Finally, in this method the design, that is, the structure, of the first electronic component or components is uncoupled from or is independent of that of the second electronic component or components. The first and second electronic components are not necessarily aligned relative to each other.

The first electronic component may be made at a face of the second semiconductor layer opposite to that in contact with the second dielectric layer. The second electronic component may be made in a face of the first semiconductor layer opposite to that in contact with the first dielectric layer.

The first and/or the second electronic components may be MOS type transistors. It is also possible for the first and/or the second electronic components to be MEMS or NEMS type devices or even sensors of micrometric or nanometric dimensions.

The method may, before the first part of the electrically conductive material is made, also comprise the making of a first ground plane on the first dielectric layer, wherein the second dielectric layer can also cover the first ground plane, and wherein the second electronic component can be made such that an active zone of the second electronic component is arranged at least in part facing the first ground plane. Thus when the second electronic component is a transistor, this method allows this first ground plane to be arranged between the two levels of electronic components which allows the threshold voltage of the transistor which corresponds to the second electronic component to be adjusted.

The method may in addition, before the first electronic component is made, also comprise the making of a thermal and electrostatic plane in the second dielectric layer or between the first and second dielectric layers and such that the thermal and electrostatic screen and the first portion of electrically conductive material are arranged in two levels superposed one above the other. Thus this method allows a thermal and electrostatic screen to be arranged between the two levels of electronic components, to protect in particular the first electronic component against the steps implemented to make the second electronic component, or vice versa. It is possible for the thermal and electronic screen to be made after the first portion of the electrically conductive material, the screen in this case being arranged in the second dielectric layer or before the first portion of the electrically conductive material, the screen in this case being arranged on the first dielectric layer and the first portion of electrically conductive material being in this case arranged in the second dielectric layer.

The method may furthermore comprise, between making the first portion of electrically conductive material and making the first electronic component, the making of a second portion of electrically conductive material in the second dielectric layer, such that the first and second portions of electrically conductive materials are arranged in two levels superposed one above the other. This method allows several superposed levels of electrical interconnections to be arranged between the two levels of electronic components (with the first portion of the electrically conductive material forming part of a first level of electrical interconnections and the second portion of electrically conductive material forming part of a second level of electrical interconnections) which in particular allows the formation of local electrical interconnections linked to the electronic components of the integrated electronic circuit.

The first dielectric layer may comprise semiconductor oxide, for example $SiO_2$, and/or the first portion of electrically conductive material may comprise metal, for example tungsten, and/or the second semiconductor layer may be the surface layer of a second SOI substrate and/or the second dielectric layer may comprise semiconductor oxide, for example $SiO_2$, and/or the electrical interconnection may comprise metal, for example tungsten, and/or the first semiconductor layer may comprise a single-crystal semiconductor, for example single-crystal silicon and/or the second semiconductor layer may comprise single-crystal semiconductor, for example single-crystal silicon. The use of a single-crystal semiconductor has the particular advantage of making high performance and low power consumption electronic components.

Several first electronic components which may correspond to first NMOS and PMOS transistors may be made in the second semiconductor layer, and several second electronic component which may correspond to second NMOS and PMOS transistors may be made in the first semiconductor layer. In this configuration the active zones of the PMOS and NMOS transistors of a same level of electronic components may comprise a semiconductor of the same nature, for example silicon.

Alternatively, the method may in addition comprise, before the first portion of electrically conductive material is made, the making of a third semiconductor layer on the first semiconductor layer, where the material of the third semiconductor layer may be different from the material of the first semiconductor layer, and such that the first dielectric layer can cover the third semiconductor layer, and several second electronic components which may correspond to second NMOS and PMOS transistors may be made such that the active zones of the second NMOS transistors are made in the first semiconductor layer and such that the active zones of the second PMOS transistors are made in the third semiconductor layer. Thus it is possible to use different semiconductor materials to make second NMOS and PMOS transistors, for example silicon for making second NMOS transistors and SiGe for making second PMOS transistors.

The method may in addition comprise, between making the first portion of electrically conductive material and making the first electronic components, making a fourth semiconductor layer arranged between the second dielectric layer and the second semiconductor layer, where the material of the fourth semiconductor layer may be different from the material of the second semiconductor layer, and where several first electronic components corresponding to first NMOS and PMOS transistors may be made such that the active zones of the first NMOS transistors are made in the second semiconductor layer and such that the active zones of the first PMOS transistors are made in the fourth semiconductor layer. Thus it is possible to use different semiconductor materials to make first NMOS and PMOS transistors, for example silicon for making the first NMOS transistors and SiGe for making the first PMOS transistors.

The first semiconductor layer may be the surface layer of a first SOI substrate and the bulk layer and the buried dielectric layer of the first SOI substrate may be separated from the first semiconductor layer after making the first electronic component and before making the second electronic component.

The first part of the electrical interconnection may be made by etching at least one first hole through the first dielectric layer and by filling the first hole with an electrically conductive material, then the second part of the electrical interconnection may be made by etching at least one second hole through at least one part of the second dielectric layer and by filling the second hole with electrically conductive material.

In this case the method may in addition comprise, after making the first part of the electrical interconnection, making one or more first metallisation levels on the second electronic component, and may in addition comprise, after making the second part of the electrical interconnection, making one or more second metallisation levels on the first electronic component.

The second electronic component may be arranged between the second semiconductor layer and the first metallisation level or levels. The first electronic component may be arranged between the first semiconductor layer and the second metallisation level or levels. The electronic components may be arranged between the first and second metallisation levels The interconnection or interconnections formed between the two levels of electronic components may directly connect two electronic components or may form a by-pass or a branch or be made by the levels of metallisation.

BRIEF DESCRIPTION OF THE DRAWINGS

The present invention will be better understood on reading the description of example embodiments given, purely as an indication and in no sense restrictively, making reference to the appended illustrations in which.

Identical, similar or equivalent parts of the various figures described below have the same numerical references, to make it easier to move from one figure to another.

In order to make the figures more readable, the various parts shown in the figures are not necessarily shown at a uniform scale.

The various possibilities (variants and embodiments) must be understood as not being mutually exclusive, and being capable of being combined with one another.

DETAILED DESCRIPTION OF SPECIFIC EMBODIMENTS

FIGS. 1 to 16 show the steps of a method to make a three-dimensional integrated electronic circuit 100 according to a particular embodiment. In FIGS. 1 to 16, only part of the circuit 100 wherein two first and two second electronic components are made is shown in side section views. Nevertheless, circuit 100 may comprise a greater number of first electronic components made on the first level of electronic components and/or a greater number of second electronic components made on the second level of electronic components.

Figure 1:
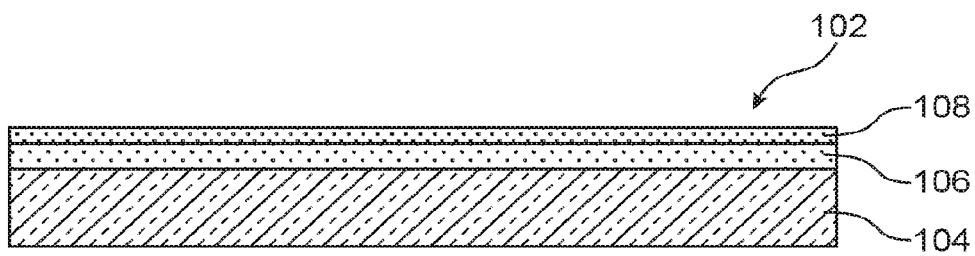
FIGS. 1 to 16 show the steps of a method for making a three-dimensional integrated electronic circuit, according to a particular embodiment.

As shown in FIG. 1, the circuit 100 is made from a first substrate 102 of the SOI type comprising a bulk layer 104 of semiconductor, a buried dielectric layer 106 (also called BOX or 'buried oxide' layer) and a surface layer 108 of semiconductor. In the embodiment described here, the bulk layer 104 comprises silicon and has a thickness equal to several hundred microns, the buried dielectric layer 106 comprises $SiO_2$ and has a thickness of for example between about 10 nm and 3 μm, and the surface layer 108 comprises silicon and has a thickness less than about 10 μm and advantageously less than about 100 nm (this thickness being advantageously adjusted to the thickness required for making the active zones of NMOS transistors). Alternatively, the first substrate 102 could be a bulk semiconductor substrate or a substrate of a type other than SOI.

The surface layer 108 is intended to be located at a second side of the circuit 100 at whose level the second electronic components are to be made, for example second PMOS transistors and second NMOS transistors. The circuit 100 also comprises a first side, opposite the second side, at whose level the first electronic components are to be made, for example first PMOS transistors and first NMOS transistors, in another layer of semiconductor.

Figure 2:
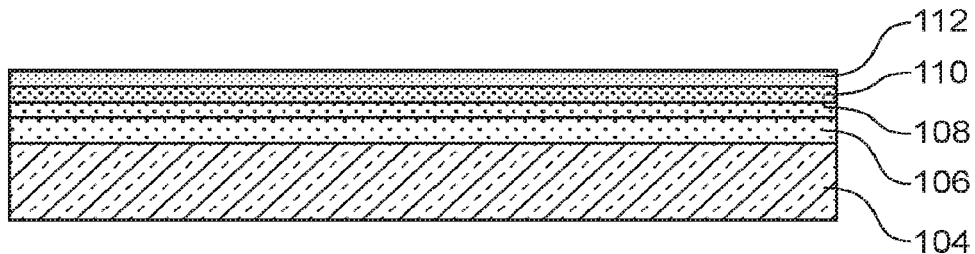

As shown in FIG. 2, a layer 110 comprising a different semiconductor to that of the surface layer 108 is made on the surface layer 108. In the embodiment described here the layer 110 is made because second MOS transistors of different conductivities (NMOS and PMOS) are intended to be made at the second side of the circuit 100 where the semi-conductive layers 108 and 110 are located, the semiconductor of the layer 110 being suitable for making the active zones of the second transistors with a first type of conductivity (for example PMOS) and the semiconductor of the surface layer 108 is suitable for making the active zones of the second transistors with a second type of conductivity (for example NMOS). The layer 110 here corresponds to a layer of SiGe made using epitaxy, comprising a proportion of germanium of between 5% and 50% and with a thickness of between 5 nm and 20 nm.

Alternatively, it is possible for this layer 110 not to be made, for example if the second electronic components do not need to be made from two different semiconductors (MOS transistors of the same conductivity, or NMOS and PMOS transistors made only from the semiconductor of the surface layer 108, or electronic components other than MOS transistors made only from the semiconductor of the surface layer 108).

A dielectric layer 112 is then made on the layer 110 (or on the surface layer 108 if the layer 110 is omitted). The layer 112 comprises, for example, $SiO_2$ made by high-temperature oxidation (HTO), for example at between about 600° C. and 850° C. The layer 112 may also correspond to a stack of several dielectric layers, for example a stack of a first layer of $SiO_2$, a second layer of SiN and a third layer of $SiO_2$. The thickness of the layer 112 is for example between about 5 nm and 15 nm. Alternatively, it is possible for the layer 110 to be covered with a very thin deposit of silicon made by epitaxy, prior to making the dielectric layer 112, in order to prevent enrichment of the layer 110 with germanium by the oxidation then carried out.

Advantageously, a layer of compressive material, for example SiN may be arranged between the layers 110 and 112 in order to induce a stress in the semiconductor of layer 110, which promotes the mobility of the holes in this semiconductor. In the particular embodiment described here, this layer of compressive material allows optimisation of the operation of the two PMOS transistors whose active zones are to be made within the layer 110. This layer of compressive material is not visible in FIG. 2. If the layer 110 is omitted, the layer of compressive material can be arranged between the layers 108 and 112, and thus induce a stress in the semiconductor of the surface layer 108.

It is also possible to use both a material which induces a tensile stress in the second NMOS transistor or transistors and a material which induces a compressive stress in the second PMOS transistor or transistors. For example, the material that induces the tensile stress is first of all deposited, and then lithography then etching and removal are implemented in order to preserve this material at the active zones of the NMOS transistors. The material which induces a compressive strain is then deposited. Lithography, etching and removal are carried out in order to preserve this material at the active zones of the PMOS transistors. The two etchings carried out are stopped at the surface of the semiconductor. These materials are inserted between the semiconductors (N and P) and the ground planes of the transistors intended to be made.

Figure 3:
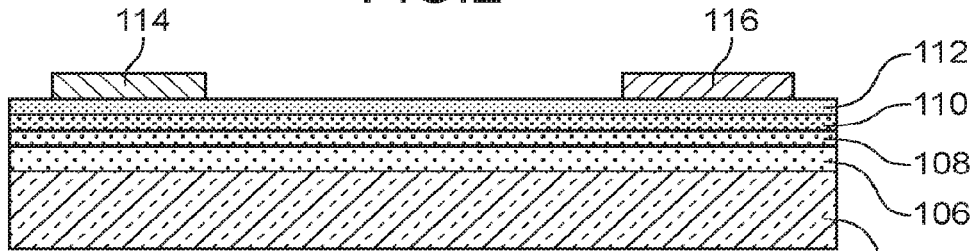

Ground planes 114 and 116 (intended to be coupled to the second PMOS and NMOS transistors) are then made on the dielectric layer 112 (FIG. 3). For this a deposit of a layer of electrically conductive material, here polysilicon, is deposited on the dielectric layer 112. Lithography and etching of this layer of electrically conductive material are then carried out so that the remaining portions of this electrically conductive layer are intended to form ground planes 114, 116. The lithography and N and P type dopant implantation steps (depending on the conductivity of the transistors that it is intended to couple to these ground planes) in the remaining portions of the electrically conductive layer are then carried out. The ground planes 114 and 116 made have, for example, a thickness of between about 10 nm and 20 nm.

The making of these ground planes 114, 116 may be omitted if the second electronic components do not require such ground planes (for example in the case of second electronic components which do not correspond to CMOS transistors with adjustable threshold voltages).

At this stage in the method a first level of electrical interconnections is made which is intended to form a part of the local electrical interconnections and to be arranged between the first and second electrical components which are located on each side of the circuit 100. These local electrical interconnections are intended to electrically link one of the first electronic components to one of the second electronic components and/or to electrically link electronic components located on the same side of the circuit 100 (for example two first electronic components or two second electronic components).

For this an etch stop layer 118 comprising a dielectric material such as SiN is deposited on the dielectric layer 112 and also covers the ground planes 114 and 116. The etch stop layer 118 is for example deposited in a conforming manner onto the dielectric layer 112 and the ground planes 114, 116 with a thickness of between about 5 nm and 10 nm. A layer of $SiO_2$ with a thickness of for example between about 20 nm and 40 nm may be deposited prior to the deposition of this layer of SiN.

Another dielectric layer 120, comprising for example $SiO_2$, is then deposited onto the etch stop layer 118 then planarised for example by CMP (chemical-mechanical planarisation) such that the dielectric layer 120 has a final thickness of between about 40 nm and 80 nm.

Lithography and etching steps (with stopping on the etch stop layer 118) are then carried out in order to form, through the dielectric layer 120, openings intended to form locations for making portions 124 of electrically conductive material which form the first level of electrical interconnections. In the embodiment described here a single opening is made in the dielectric layer 120.

A barrier layer 122, for example of Ti/TiN type and with a thickness of between about 3 nm and 7 nm, is then deposited in a conforming manner onto the dielectric layer 120 as well as in the openings previously made through the dielectric layer 120, thus covering the lateral walls and the bottom wall of these openings.

A layer of electrically conductive material comprising, for example tungsten and with a thickness of between about 40 nm and 80 nm is then deposited onto the barrier layer 122 such that the openings made in the dielectric layer 120 are filled with this electrically conductive material. This layer of tungsten is for example made by chemical vapour deposition (CVD) carried out using $WF_6$. The barrier layer 122 forms a bond layer for the deposition of this conductive layer and also limits the diffusion of fluorine resulting from the deposition of tungsten into the materials located beneath the barrier layer 122.

The making of the portions 124 of electrically conductive material intended to form the first level of electrical interconnections is then achieved by planarisation which removes the electrically conductive material present outside the openings. This planarisation is either carried out with stopping on the dielectric layer 120 or with stopping on the portions of the etch stop layer 118 which cover the ground planes 114, 116.

Figure 4:
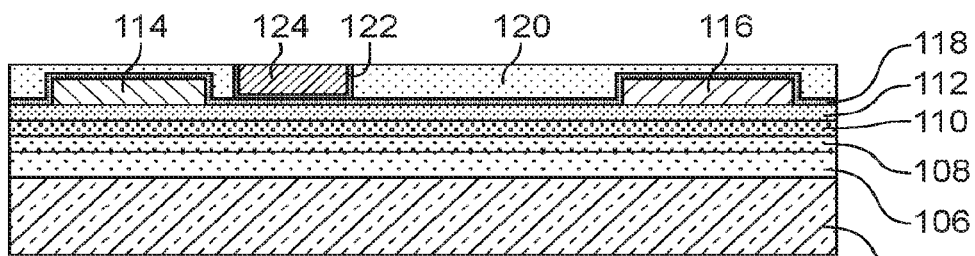

The structure obtained at this stage in the method is shown in FIG. 4. In this figure a single portion 124 of electrically conductive material intended to form part of a local electrical interconnection is shown.

Unlike that which is usually carried out during sequential integration, the lithographic alignment sequences carried out are here modified, with the alignment reference levels no longer being those formed by the transistor active zones or transistor gates, but those formed by the ground planes or by the electrical interconnection level or levels intended to link the transistors together. The first and second electronic components may therefore be made aligned or not aligned relative to one another.

At this stage of the method it is possible to make a thermal and electrostatic screen whose role is to limit any impact of the thermal budget linked to the making of the second electronic components as against the first electronic components which will be made before the second electronic components.

Figure 5:
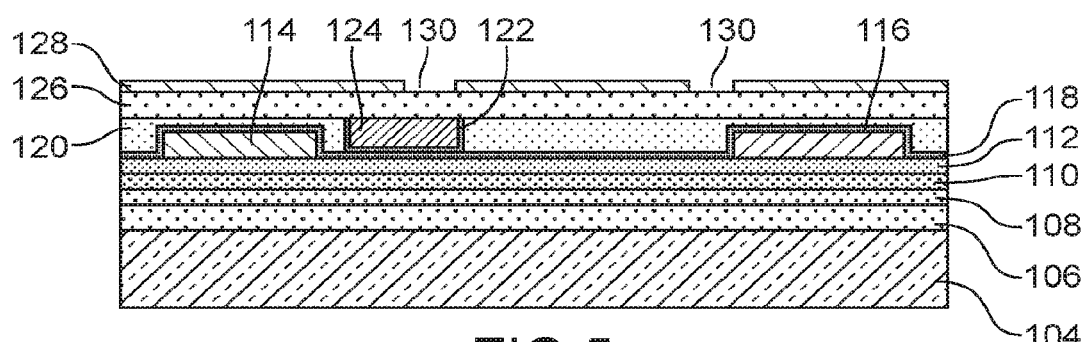

Thus as shown in FIG. 5, a dielectric layer 126 is deposited on the structure obtained previously, that is, on the dielectric layer 120 and on the conductive portion 124 (and possibly on the parts of the etch stop layer 118 covering the ground planes 114, 116 if the prior planarisation was carried out with a stop on these parts of the etch stop layer 118). This dielectric layer 126 corresponds, for example, to a layer of $SiO_2$ or a layer of SiN, or a stack of a layer of $SiO_2$ and of a layer of SiN, and has a thickness, for example, of between about 5 nm and 10 nm.

A screen layer 128 intended to form the thermal and electrostatic screen is then deposited on the dielectric layer 126. This screen layer 128 comprises, for example $Al_2O_3$, doped polysilicon, an alloy of silicon and of titanium, a Ti/TiN and tungsten stack or a stack of several of these materials. The thickness of the screen layer 128 is, for example, between about 5 nm and 10 nm. Openings 130 may be made through the screen layer 128 so as to allow future local electrical interconnections of the circuit 100 to pass through.

Figure 6:
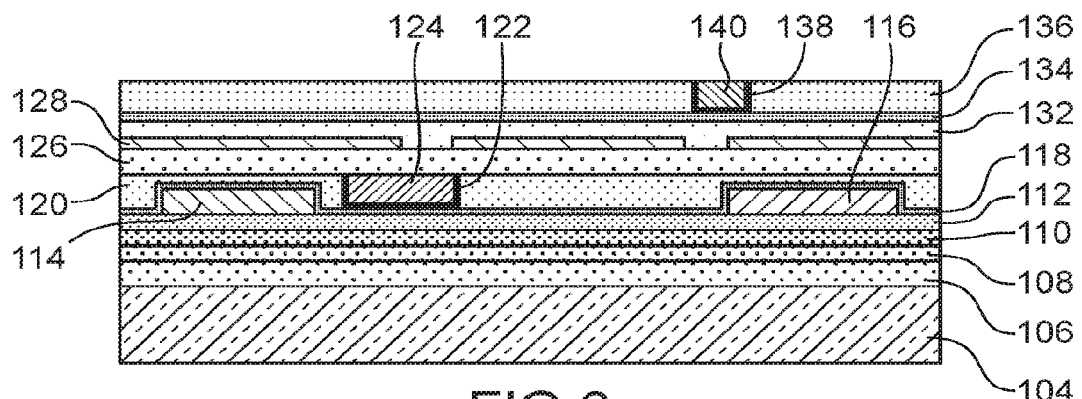

A dielectric layer 132 comprising, for example, $SiO_2$, is then deposited onto the screen layer 128 and in any openings 130 made through the screen layer 128 (see FIG. 6). This dielectric layer 132 is then planarised such that its thickness is for example between 5 nm and 20 nm.

Alternatively, the making of this thermal and electrostatic screen may be omitted.

It is possible to make a second level of electrical interconnections intended to be arranged between the first and second electronic components located on each side of the circuit 100. As for the first level formed by the portion or portions 124, the conductive elements of the second level of electrical interconnections are intended to electrically link a first electronic component to a second electronic component and/or electronic components located on the same side of the circuit 100.

For this an etch stop layer 134 comprising a dielectric material such as SiN and with a thickness between 5 nm and 10 nm is then deposited on the dielectric layer 132.

Another dielectric layer 136, which comprises for example $SiO_2$ and with a thickness of between about 20 nm and 40 nm, is then deposited on the etch stop layer 134.

Lithography and etching steps (with stopping on the etch stop layer 134) are then carried out in order to make, through the dielectric layer 136, openings intended to form locations for making portions 140 of electrically conductive material intended to form the second level of electrical interconnections. In the embodiment described here a single opening is made in the dielectric layer 136.

A barrier layer 138, for example of Ti/TiN type and with a thickness of between about 3 nm and 7 nm, is then deposited in a conforming manner onto the dielectric layer 136 as well as in the openings previously made through the dielectric layer 136, thus covering the lateral walls and the bottom wall of these openings.

A layer of electrically conductive material comprising, for example, tungsten and with a thickness of between about 20 nm and 40 nm is then deposited onto the barrier layer 138 such that the openings made in the dielectric layer 136 are filled with this electrically conductive material. This layer of tungsten is for example made by CVD deposition carried out using $WF_6$. The barrier layer 138 forms a bond layer for the deposition of this conductive layer and also limits the diffusion of fluorine resulting from the deposition of tungsten into the materials located beneath the barrier layer 138.

The making of portions 140 of the electrically conductive material is then achieved by planarisation, for example by CMP, eliminating the electrically conductive material present outside the openings. This planarisation is achieved using a stop on the dielectric layer 136.

The structure obtained at this stage in the method is shown in FIG. 6. In this figure a single portion 140 of electrically conductive material intended to form part of the second level of electrical interconnections is shown.

In the method described here, two levels of electrical interconnection are made. Alternatively, it is possible for only one of these two levels to be made. It is also possible to make more than two levels of electrical interconnections, by separating these various levels with a layer of dielectric material.

A dielectric layer 142 comprising for example $SiO_2$ is then deposited, covering the dielectric layer 136 as well as the portions 140 of the electrically conductive material.

Figure 7:
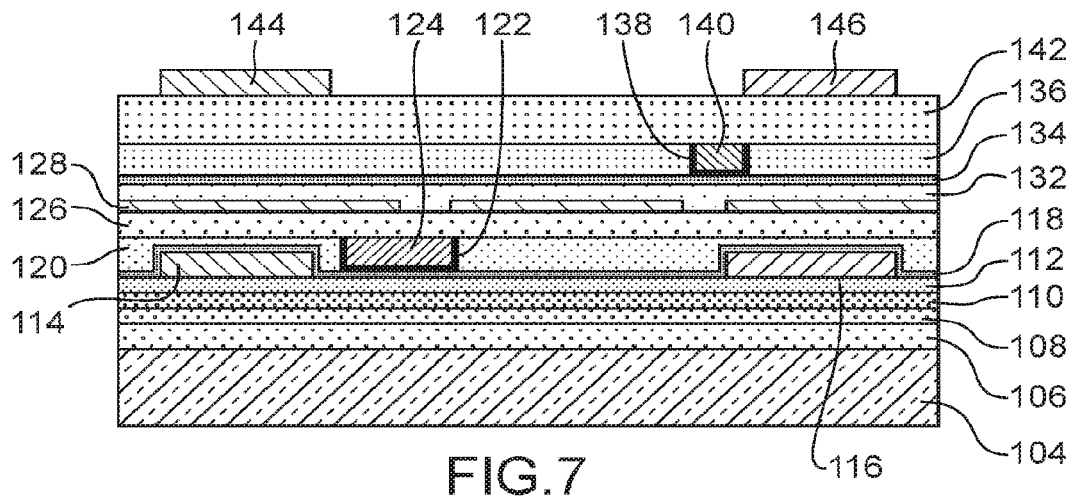
Figure 8:
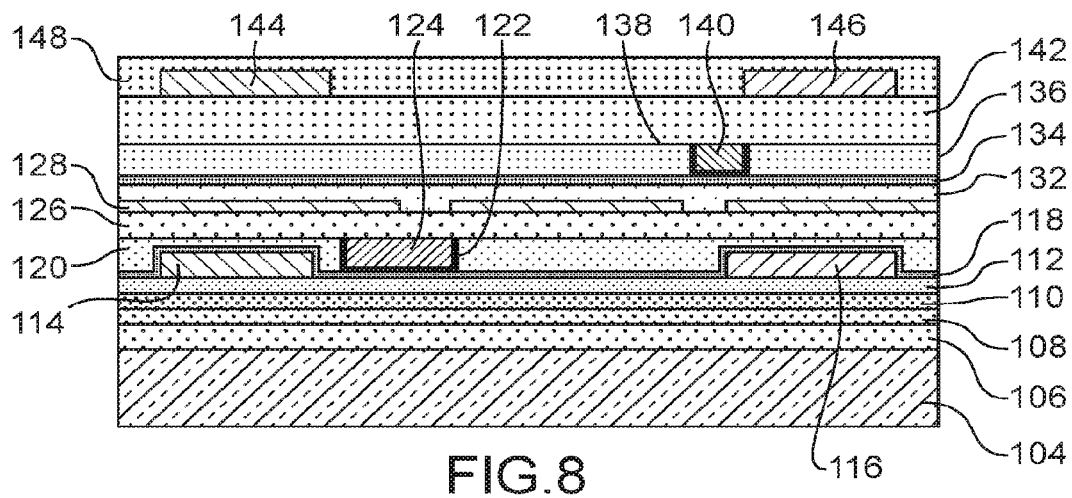

Ground planes 144 and 146 (intended to be coupled to the first PMOS and NMOS transistors) are then made on the dielectric layer 142 (FIG. 7). For this a deposit of a layer of electrically conductive material, here polysilicon, is deposited on the dielectric layer 142. Lithography and etching of this conductive layer are then carried out so that the remaining portions of this conductive layer are intended to form ground planes 144, 146. Steps involving lithography and of implantation of dopants in the remaining portions are then implemented. The ground planes 144 and 146 made have, for example, a thickness of between about 10 nm and 20 nm.

Making these ground planes 144, 146 can be omitted if the first electronic components do not require such ground planes.

A semiconductor layer intended for making first electronic components will then be made, for example by bonding, onto the previously made structure. In order to prepare this bonding, a dielectric layer 148, comprising for example $SiO_2$, is deposited on the dielectric layer 142 and also covers the ground planes 144, 146. The dielectric layer 148 is then planarised.

The semiconductor layer intended for making the first electronic components corresponds to the surface layer of a second substrate 150 of SOI type comprising a bulk layer 152 of semiconductor, a buried dielectric layer 154 and the surface semiconductor layer 156. In the embodiment described here, the bulk layer 152 comprises silicon, the dielectric layer 154 comprises $SiO_2$ of thickness of between about 10 nm and 3 µm, and the surface layer 156 comprises silicon with a thickness less than about 10 µm and advantageously less than about 100 nm (thickness adjusted depending on the thickness required for making NMOS type transistors). Alternatively, the first substrate 150 could be a bulk semiconductor substrate or a substrate of a type other than SOI.

Figure 9:
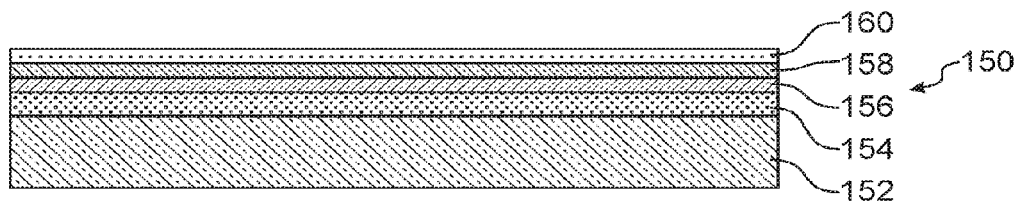

As shown in FIG. 9, a layer 158 comprising a semiconductor which is different to that of the surface layer 156 is made on the surface layer 156. In the embodiment described here the layer 158 is made because it is intended to make first MOS transistors of different conductivities at the first side of the circuit 100 where the semiconductor of the layer 158 is suitable for making the active zones of the first transistors with a first type of conductivity (for example PMOS) and the semiconductor of the surface layer 156 is suitable for making the active zones of the first transistors with a second type of conductivity (for example NMOS). The layer 158 here corresponds to a layer of SiGe made using epitaxy, comprising a proportion of germanium of between 5% and 50% and with a thickness of between 5 nm and 20 nm.

Alternatively, it is possible for this layer 158 not to be made, for example, if the first electronic components do not need a semiconductor different to that of the surface layer 156 (MOS transistors of the same conductivity, or NMOS and PMOS transistors made only from the semiconductor of the surface layer 156, or electronic components other than MOS transistors).

A dielectric layer 160 is then made on the layer 158 (or on the surface layer 156 if the layer 158 is omitted). The layer 160 comprises, for example, $SiO_2$ made using HTO. The layer 160 may also correspond to a stack of several dielectric layers, for example a stack of a first layer of $SiO_2$, of a second layer of SiN and of a third layer of $SiO_2$. The thickness of the dielectric layer 160 is, for example, between about 5 nm and 15 nm.

Advantageously, a layer of compressive material, for example SiN may be arranged between the layers 158 and 160 in order to induce a stress in the semiconductor of layer 158, which promotes the mobility of the holes in this semiconductor. In the particular embodiment described here, this layer of compressive material allows optimisation of the operation of the first PMOS transistors whose active zones are to be made within the layer 158. This layer of compressive material is not visible in FIG. 9. If the layer 158 is omitted, the layer of compressive material can be arranged between the layers 156 and 160, and thus induce a stress in the semiconductor of the surface layer 156.

It is also possible for material that induces tensile stress and material which induces compressive stress to be made for the first transistors, as described previously for the second transistors.

Figure 10:
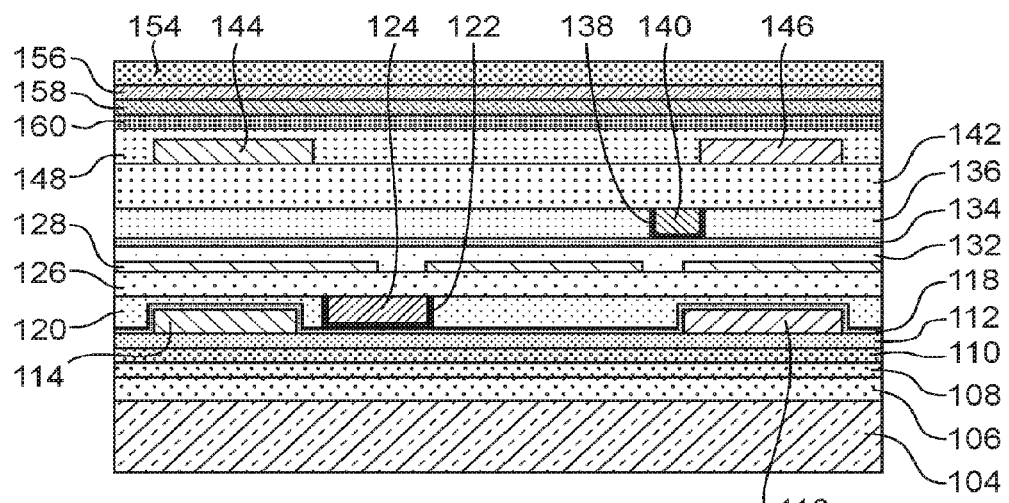

The second substrate 150 is transferred and bonded such that the dielectric layer 160 is arranged against the dielectric layer 148, for example by direct bonding (also known as molecular bonding) of $SiO_2$—$SiO_2$ (FIG. 10).

A densification annealing of this bonding may be carried out here under the best possible conditions since the materials present are all compatible with relatively high temperatures (±800° C.).

The bulk layer 152 of the second substrate 150 is removed, for example, by mechanical abrasion and chemical etching (via a solution of TMAH), with the buried dielectric layer 154 able to act as a stop layer for this etching. The buried dielectric layer 154 is then removed, for example using chemical etching using a solution of HF.

The structure obtained at this stage of the process therefore comprises a first semi-conductive layer 108 and a second semi-conductive layer 156 between which are located, in particular:
- a first dielectric layer 112;
- several dielectric layers 118, 120, 126, 132, 134, 136, 142, 148 and 160 which together may be regarded as forming a second dielectric layer;
- two levels of electrical interconnections 124, 140 arranged in the second dielectric layer;
- first ground planes 114, 116 arranged on the first dielectric layer and covered by the second dielectric layer;
- second ground planes 144, 146 arranged in the second dielectric layer;
- a thermal and electrostatic screen 128 arranged in the second dielectric layer.

Figure 11:
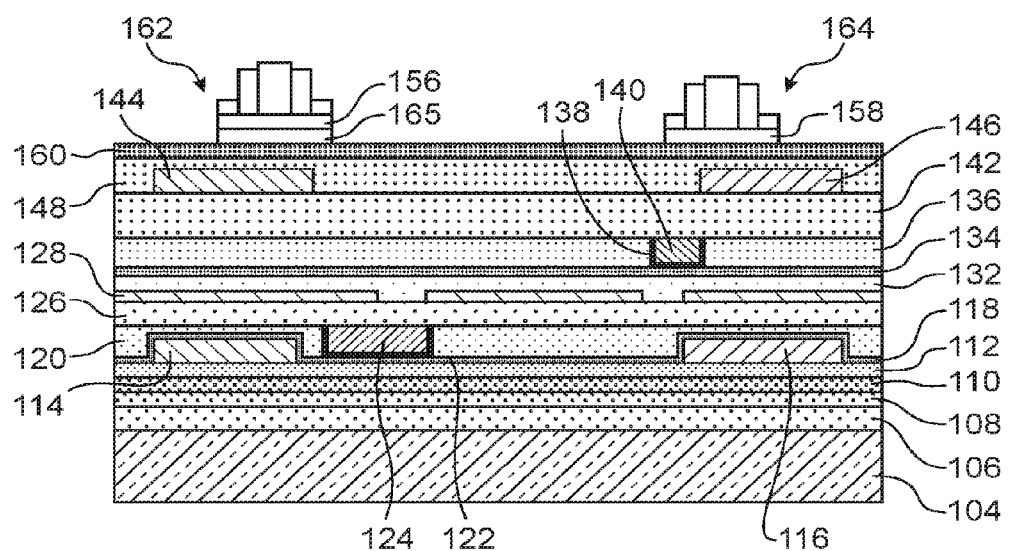
Figure 12:
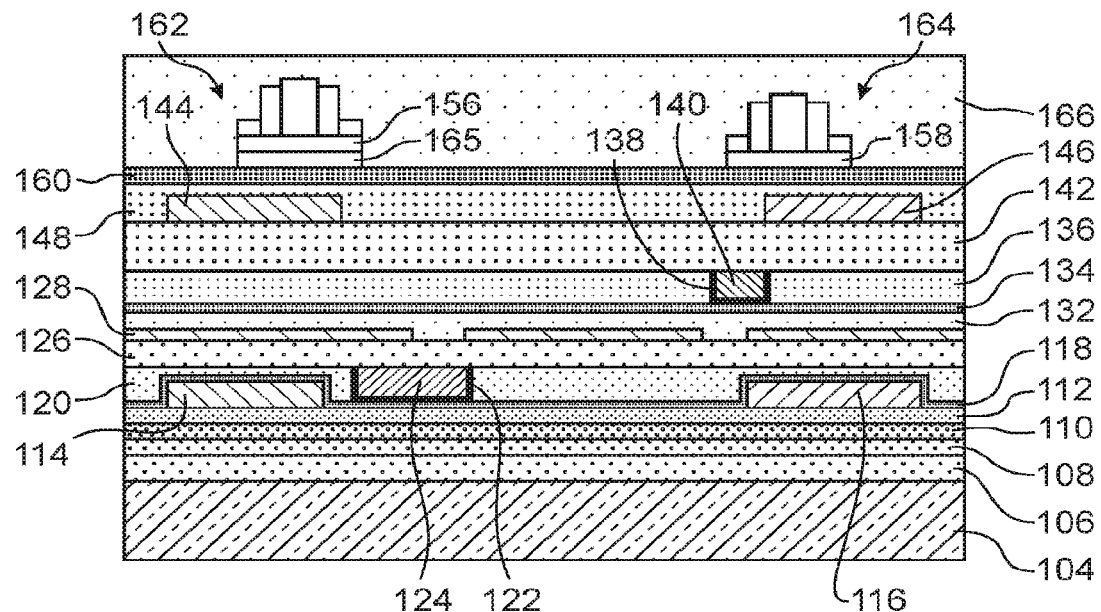

As shown in FIG. 11, the first electronic components, here first NMOS transistors 162 and first PMOS transistors 164 are made in active layers 156 and 158 from the second substrate 150 using steps which correspond to those conventionally carried out to make CMOS transistors. The first PMOS transistors 164 may be made by etching the parts of the surface layer 156 located at these transistors, due to the fact that the active zones of the first PMOS transistors 164 are formed by parts of the SiGe layer 158. For making the first NMOS transistors 162, after making the gate and spacers of this layer and having etched the layers 156 and 158 to form the active zones of the first NMOS transistors 162, the parts of the SiGe layer 158 located beneath the active zones of the first NMOS transistors 162 (which are formed by parts of the surface layer 156 of silicon) as well as any parts of the layer of compressive material located beneath the active zones of the first NMOS transistors 162 may be eliminated, for example using dry isotropic etching and after masking the first PMOS transistors to protect the active zones of these transistors against the etching being carried out, then replaced by a conforming deposit of oxide ($SiO_2$) of HTO type or of a nitride (SiN) numbered 165. The portions of these materials that cover the first PMOS transistors 164 may be etched, having masked the first NMOS transistors 162 beforehand.

The material 165 chosen to replace the material of the layer 158 beneath the active zones of the first NMOS transistors 162 is advantageously a material suitable for placing the materials in the active zones of the first transistors NMOS 162 under tension in order to promote the mobility of the electrons of these transistors such as, for example, nitride.

A protective oxide present on the surface of the source and drain zones of the first transistors 162, 164 and which masks the zones which are not intended to undergo epitaxial growth, is sequentially removed in order to implement the epitaxial growth processes required to make the source and drain regions of the first transistors 162, 164.

The materials that are present allow high temperature methods (>650° C.) to be used, which favours the feasibility and quality of the first electronic components.

The first electronic components 162, 164 are then covered with a dielectric layer 166, comprising for example $SiO_2$ with a thickness of between about 100 nm and several hundred nanometers, for example 300 nm, deposited and planarised. This dielectric layer 166 can cover the first transistors 162, 164 whereas silicidation of the contacts of these first transistors 162, 164 has not been carried out, this silicide being sensitive to the thermal budgets used.

Alternatively, the first transistors 162, 164 may be made according to a method known as "gate last", that is, by making the gates of these transistors after the other elements of these transistors. In this alternative the material which replaces the material of the layer 158 beneath the active zones of the NMOS transistors 162 is deposited. Oxide (TEOS) is then deposited. NMOS transistors 162 are then masked and then the previously deposited materials arranged on the PMOS transistors 164 are then removed by, for example, etching. A compressive material such as nitride deposited by PECVD (for example SiN) and a layer of TEOS oxide with a thickness of between 20 nm and 40 nm is then deposited for PMOS transistors 164. PMOS transistors 164 are then masked and then the compressive material arranged on the NMOS transistors 162 is then removed by, for example, etching. A tensile stressing material, comprising for example nitride deposited by PECVD, such as SiN is then deposited and etched in order to be arranged on the NMOS transistors 162. A dielectric material, for example $SiO_2$, which forms a part of the dielectric layer 166 is then deposited by covering the first transistors 162, 164, then planarized with stopping on the temporary gates comprising, for example polycrystalline silicon or amorphous silicon for the gate and $SiO_2$ for the gate dielectric with which the first transistors 162, 164 were made. These temporary gates are then removed for example using dry etching. A high-permittivity (High-K) gate dielectric and a gate metal are then deposited to form gate dielectrics and the gates of the first transistors 162, 164. Planarization is then carried out to remove the excess deposited metal. The dielectric layer 166 is then made by once more depositing a dielectric material.

The metals of the transistor gates may be different depending on the type, N or P, of the transistors. In this case a height difference between the NMOS transistors 162 and PMOS transistors 164, as is the case in the example described here due to the fact that the active zones of these transistors are made from different semi-conductive superposed layers may be an advantage for incorporating these different gate metals.

If it is intended that the material of the dielectric layer 166 be completely removed later, in particular to make auto-aligned contacts on the sources and drains of the transistors, if may be judicious to deposit a stop layer comprising for example nitride such as SiN, or $HfO_2$, prior to deposition of the dielectric layer 166.

Figure 13:
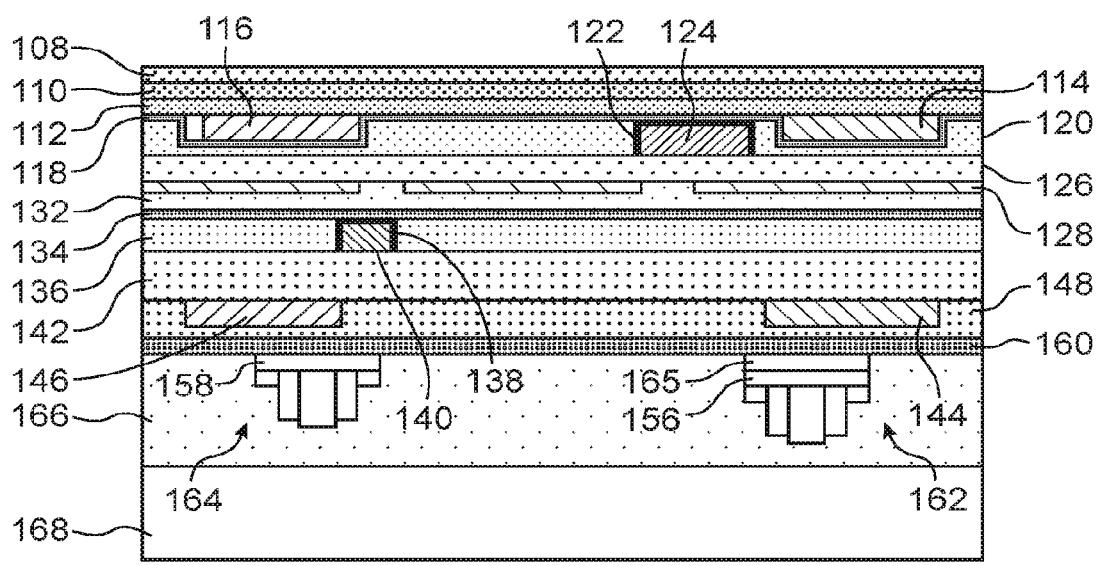

As shown in FIG. 13, the structure obtained is then turned over and the dielectric layer 166 is firmly attached to a third substrate 168 which corresponds for example to a bulk substrate of oxidized silicon which allows firm attachment through oxide-oxide direct bonding with the dielectric layer 166. Since this bonding is temporary, it is not necessary to densify it using annealing.

The bulk layer 104 and the buried dielectric layer 106 from the first substrate 102 are then removed using, for example, mechanical then chemical abrasion (with a solution of TMAH) for the bulk layer 104 and using chemical etching (using a 1% or 0.1% solution of HF) for the buried dielectric layer 106.

Figure 14:
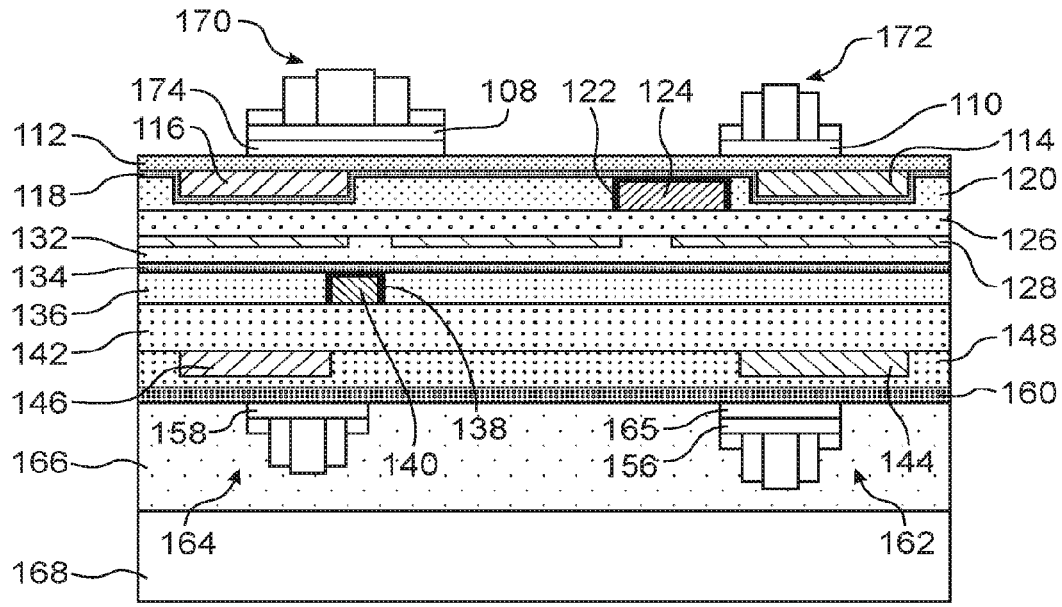

As shown in FIG. 14, the second electronic components, here second NMOS transistors 170 and second PMOS transistors 172 are made in active layers 108 and 110 from the first substrate 102 using steps which correspond to those conventionally carried out to make CMOS transistors. The second PMOS transistors 172 may be made by etching the parts of the surface layer 108 located at these transistors, due to the fact that the active zones of the second PMOS transistors 172 are formed by parts of the SiGe layer 110. For making the second NMOS transistors 170, after making the gate and spacers of this layer and having etched the layers 108 and 110 to form the active zones of the second NMOS transistors 170, the parts of the SiGe layer 110 located beneath the active zones of the second NMOS transistors 170 (which are formed by parts of the surface layer 108 of silicon) as well as any parts of the layer of compressive material located beneath the active zones of the second NMOS transistors 170 may be eliminated, for example using dry isotropic etching and after masking the second PMOS 172 transistors to protect the active zones of these transistors against the etching being carried out, then replaced by a conforming deposit of oxide ($SiO_2$) of HTO type or of a nitride (SiN) numbered 174. The portions of these materials that cover the second PMOS transistors 172 may be etched, having masked the second NMOS transistors 170 beforehand.

The material 174 chosen to replace the material of the layer 110 beneath the active zones of the second NMOS transistors 170 is advantageously a material suitable for placing the materials in the active zones of the second transistors NMOS 170 under tension in order to promote the mobility of the electrons of these transistors such as, for example, nitride deposited by PECVD, such as SiN.

The protective oxide, whose thickness is for example between about 5 nm and 10 nm, made on the surface of the source and drain zones of the second transistors 170, 172 is sequentially eliminated in order to carry out the epitaxial growth steps required to make the source and drain regions of the second transistors 170, 172.

The materials that are present allow high temperature methods to be used, which favour the feasibility and quality of the second electronic components.

The end of the implementation of the epitaxial growth steps corresponds to the end of the so-called "Front-end" steps which use high temperatures of the order or 1000° C. or more.

The epitaxial growth steps previously carried out are preferably epitaxial growth steps which are doped in situ in order not to have to thermally activate the implantation at very high temperatures. The epitaxial growth steps carried out to make the second components are advantageously of a similar nature to those carried out for making the first components.

The steps carried out in the remainder of the method correspond to so-called "Middle-end" steps which use temperatures of up to 500° C., and so-called "Back-end" steps which use lower thermal budgets, which correspond to temperatures of lower than about 400° C.

The structures of the first electronic components are independent of those of the second electronic components, that is, the second electronic components are not made in an auto-aligned manner relative to the first electronic components. The second electronic components may therefore be aligned or not in relation to the first electronic components. The dimensions (gate lengths, width of transistors) of the first electronic components are not dependent on those of the second electronic components.

Unlike the first electronic components 162, 164 whose access zones (source and drain zones for transistors) are not silicided before deposition of the dielectric layer 166, the second electronic components 170, 172 are completely finished in particular by making silicide on the access zones of these second components 170, 172.

Figure 15:
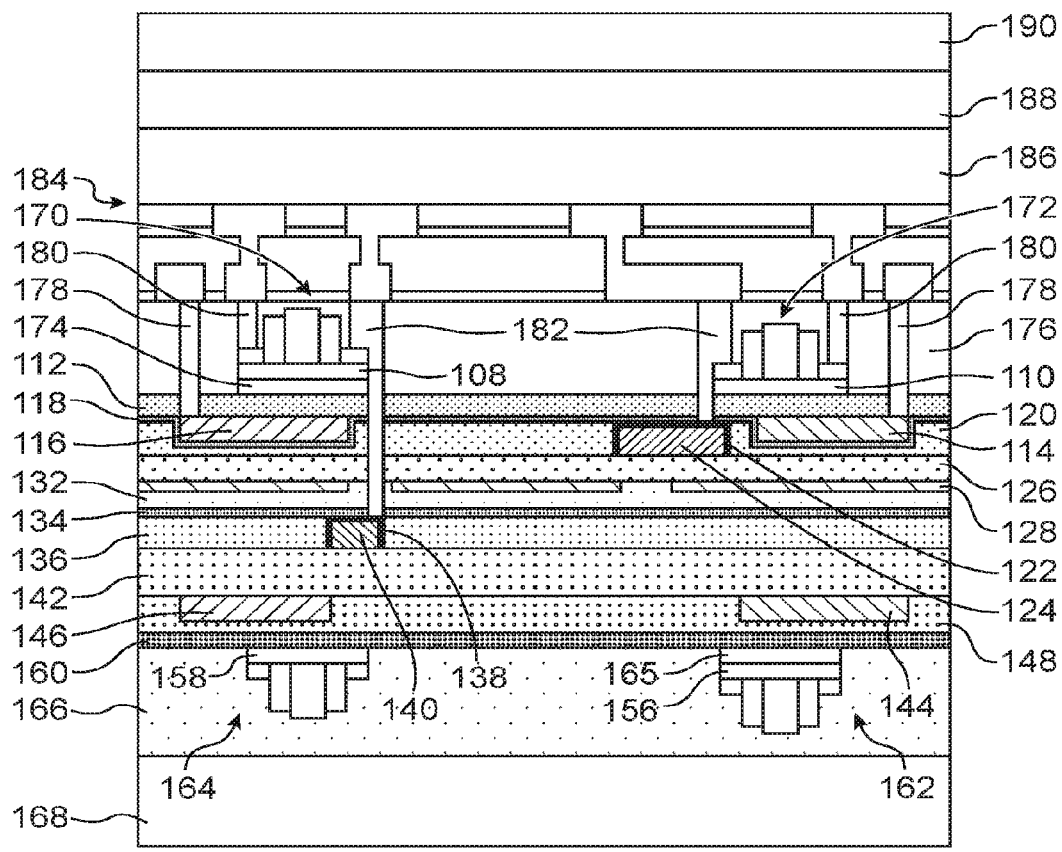

As shown in FIG. 15, a dielectric layer 176, comprising for example $SiO_2$ and whose thickness of between about 100 nm and several hundred nanometers (for example 300 nm) is then deposited by covering the second electronic components 170, 172 then planarised.

Electrical contacts or conductive vias are then made through the dielectric layer 176, in order to ensure electrical contact with the elements intended to be accessible and/or electrically linked at the second side of the circuit 100. Thus electrical contacts 178 are made such that they are electrically linked to the ground planes 114, 116 (and therefore also pass through the dielectric layer 112). Other electrical contacts 180 are made such that they are linked to the source or to the drain of the second transistors 170, 172 and therefore pass through a part of the dielectric layer 176 (these electrical contacts 180 may be made in a manner which is auto-aligned with the zones that it is intended to link them to).

Electrical contacts may be made using lithography and etching of dielectric materials, then deposition of a conductive material such as tungsten in these openings.

Other electrical contacts 182 are made not only through the dielectric layer 176 but also through other previously made dielectric layers in order to make electrical contact with the conductive portions of the electrical interconnection levels arranged between the levels of the first and second electronic components and thus make the first parts of local electrical interconnections which are intended to electrically link electronic components together. These electrical contacts 182 are here made in a shared manner, that is, they comprise a first portion which extends through a part only of the dielectric layer 176 and which is connected to the source or to the drain of the second transistors 170, 172 and a second portion which extends through the entire dielectric layer 176 and also through the other previously-made dielectric layers in order to make electrical contact with the conductive portions of the electrical interconnection levels arranged between the levels of electronic component levels. In the example in FIG. 15, one of these electrical contacts 182 comprises a first portion linked to the source or to the drain of the second NMOS transistor 170 and comprises a second portion in contact with the first portion and arranged next to the latter, which extends through the materials of layers 112, 118, 120, 126, 132 and 134 (and also passes through one of the openings 130 made through the thermal and electrostatic screen 128) to make electrical contact with the portion 140. The other electrical contact 182 shown comprises a first portion linked to the source or to the drain of the second PMOS transistor 172 and comprises a second portion in contact with the first portion and arranged next to the latter, which extends through the materials of layers 112 and 118 to make electrical contact with the portion 124.

In order to make such an electrical contact 182 it is possible to first of all etch a hole in the dielectric layer 176 in a region wherein it is intended to make the first portion of the electrical contact 182 (that is until the source or the drain of the transistor to which the electrical contact is to be linked is reached). The etched hole is then filled with a polymer material. Selective etching of the polymer material is then carried out through the dielectric material of the various layers that it is intended the second portion of the electrical contact 182 will pass through. The mask used for this etching and the polymer material are then removed together. Finally the holes made through the dielectric materials are filled with a conductive material to form the electrical contact 182.

One or more metallisation levels 184 are then made at the second side of the circuit 100. Each metallisation level comprises a metal line comprising several portions of electrically conductive material, for example of tungsten. The conductive portions of the first level of metallizations made on the dielectric layer 176 are electrically linked to the previously-made electrical contacts 178, 180 and 182. Each metallisation level also comprises a dielectric passivation layer covering the metallic line of the level. Furthermore the metallic lines of two superposed metallisation levels are linked together by conductive vias made through the dielectric passivation layer separating these metal lines.

The metallisation level or levels made at the second side of the circuit 100 are then covered by the deposition of a stack of several alternating layers of dielectric (oxide such as $SiO_2$) and of metal, in order to reconstitute a mechanical support required to handle the plate formed by the previously-formed elements in the circuit 100. This stack may be judiciously shaped and planarised to promote the removal of heat from the circuit in operation, and the handling of the plate by this stack. In the example in FIG. 15, this stack comprises a dielectric layer 186, here comprising $SiO_2$, a metallic layer 188 comprising, for example, a barrier layer of Ta and lines of copper, and finally another dielectric layer 190 also comprising $SiO_2$. The thickness of the stack formed by the layers 186, 188 and 190 may be equal to several hundred microns, for example at least 400 µm.

As an alternative to the stack formed by layers 186, 188 and 190, it is possible to cover the last metallisation level made at the second side of the circuit 100 with a planarised dielectric layer comprising, for example, $SiO_2$, and to bond this dielectric layer onto a bulk substrate of oxidized semiconductor using oxide-oxide direct bonding, this bulk substrate forming the mechanical support required to manipulate the previously-made elements of the circuit 100.

Figure 16:
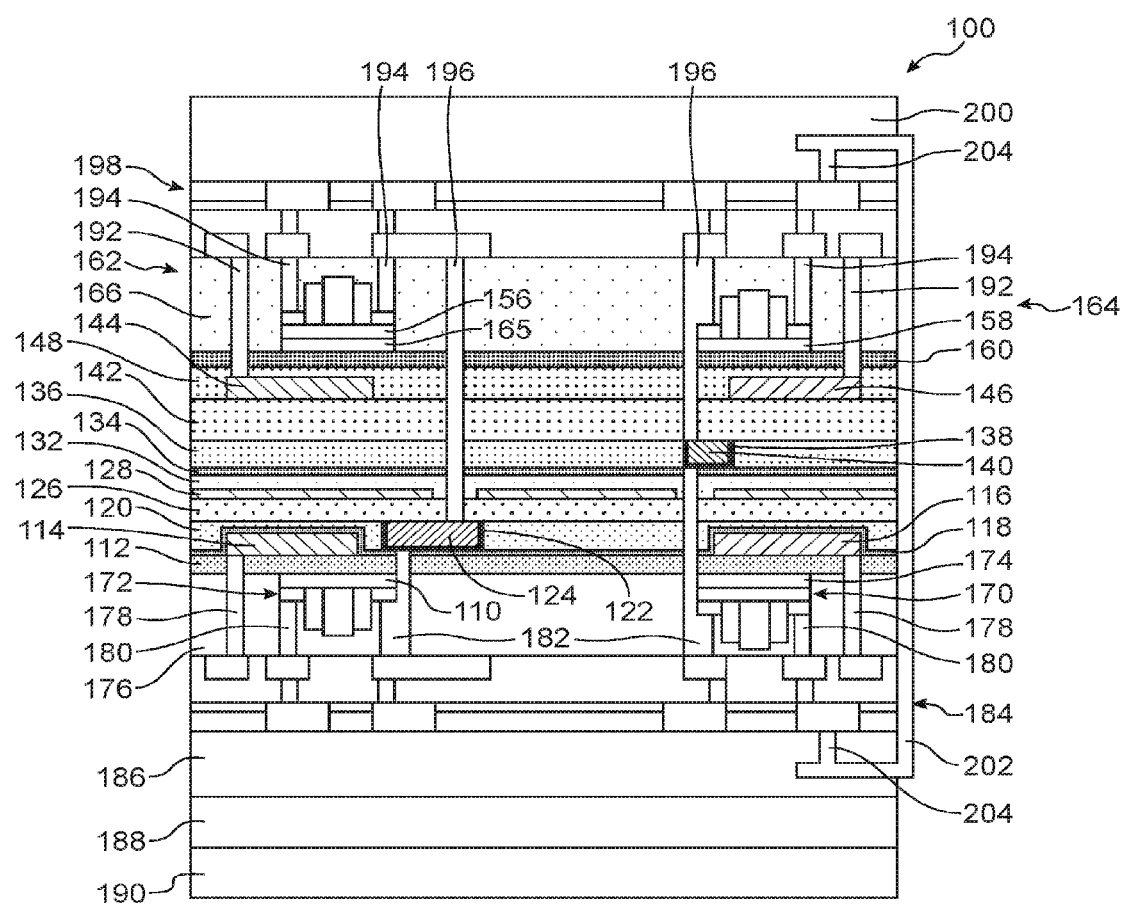

The structure made is then turned over and the third substrate 168 is removed (FIG. 16).

At this stage, as for the second transistors, it is possible to replace the temporary gates of the first transistors using similar steps to those previously described for the second transistors.

Electrical contacts, or conductive vias, are then made through the dielectric layer 166, in order to ensure electrical contact with the elements intended to be accessible and/or electrically linked at the first side of the circuit 100. Thus electrical contacts 192 are made such that they are electrically linked to the ground planes 144, 146 (and therefore also pass through the dielectric layer 160). Other electrical contacts 194 are made such that they are linked to the source or to the drain of the first transistors 162, 164 and therefore pass through a part of the dielectric layer 166 (these electrical contacts 194 may be made in an manner which is auto-aligned with the zones to which it is intended to link them).

Electrical contacts may be made using lithography and etching of the dielectric materials, then deposition of a conductive material such as tungsten in these openings.

Other electrical contacts 196 are made not only through the dielectric layer 166 but also through other previously-made dielectric layers in order to make electrical contact with the conductive portions of the electrical interconnection levels arranged between the levels of the first and second electronic components and thus make the second parts of local electrical interconnections which electrically link electronic components together. These contacts 196 may be made in a shared manner, like the electrical contacts 182 (in the case of electrical contact 196 linked to the first transistor PMOS 164), or not (as the electrical contact 196 linked to the first NMOS transistor 162 through the first metallisation level located on the first side of the circuit 100).

One or more metallisation levels 198 are then made at the first side of the circuit 100, in a manner which is analogous to the metallisation levels 184 made at the second side of the circuit 100.

The metallisation levels 198 are finally covered by a dielectric passivation layer 200 comprising, for example, $SiO_2$.

Other electrical interconnections 202 linking first electronic components to second electronic components which pass through a part of the dielectric layers 200 and 186 and all the other dielectric layers located between these two layers 186 and 200 may also be made. These electrical interconnections 202 are electrically linked to the first and second components through metallisation levels 184 and 198 and through holes 204 made in the layers 186 and 200.

Thus, in the circuit 100 made, local electrical interconnections are made between the first and second electronic components in order to link them electrically together (either a first and a second electronic components, or two first or two second electronic components). These local electrical interconnections being at the electronic component scale, their lengths do not in general exceed a few hundred nanometers and are, for example, less than about 500 nm.

Although not visible in the figures described above, interconnections linked to the transistor gates are also made in the circuit 100.

The invention claimed is:
1. A method for making a three-dimensional integrated electronic circuit comprising:
   making at least one first portion of electrically conductive material on at least one first dielectric layer covering at least one first semiconductor layer; then
   making at least one second dielectric layer covering at least the at least one first portion of electrically con- ductive material such that the at least one first portion of electrically conductive material is disposed between the at least one first dielectric layer and the at least one second dielectric layer, and at least one second semiconductor layer disposed on the at least one second dielectric layer; then making at least one first electronic component in the at least one second semiconductor layer, and at least one second electronic component in the at least one first semiconductor layer; then making at least one electrical interconnection electrically linking the at least one first electronic component and the at least one second electronic component together, of which a first part passes through at least the at least one first dielectric layer and electrically connects the at least one second electronic component to the at least one first portion of electrically conductive material, and of which a second part passes through at least one part of the at least one second dielectric layer and electrically connects the at least one first electronic component to the at least one first portion of the electrically conductive material.

2. The method according to claim 1, wherein at least one of the at least one first electronic component and the at least one second electronic component is a MOS type transistor.

3. The method according to claim 2, further comprising, before making the at least one first portion of electrically conductive material, making a first ground plane on the at least one first dielectric layer,
wherein the at least one second dielectric layer also covers the first ground plane, and
wherein the at least one second electronic component is made such that an active zone of the at least one second electronic component is disposed at least in part facing the first ground plane.

4. The method according to claim 2, further comprising, between making the at least one first portion of electrically conductive material and making the at least one first electronic component, making a second ground plane in the at least one second dielectric layer, wherein the at least one first electronic component is made such that an active zone of the at least one first electronic component is disposed facing the second ground plane.

5. The method according to claim 1, further comprising, before making the at least one first electronic component, making a thermal and electrostatic screen in the at least one second dielectric layer or between the at least one first dielectric layer and the at least one second dielectric layer, such that the thermal and electrostatic screen and the at least one first portion of electrically conductive material are disposed in two levels superposed one above the other.

6. The method according to claim 1, further comprising, between making the at least one first portion of electrically conductive material and making the at least one first electronic component, making a second portion of electrically conductive material in the at least one second dielectric layer, such that the at least one first portion of electrically conductive material and the at least one second portion of electrically conductive material are disposed in two levels superimposed one above the other.

7. The method according to claim 1,
wherein the at least one first dielectric layer comprises semiconductor oxide, and/or
wherein the at least one first portion of electrically conductive material comprises metal, and/or
wherein the at least one second semiconductor layer is a surface layer of a second SOI substrate, and/or wherein the at least one second dielectric layer comprises semiconductor oxide, and/or
wherein the at least one electrical interconnection comprises metal, and/or
wherein the at least one first semiconductor layer comprises a single-crystal semiconductor, and/or
wherein the at least one second semiconductor layer comprises a single-crystal semiconductor.

8. The method according to claim 1,
wherein several first electronic components corresponding to first NMOS and PMOS transistors are made in the at least one second semiconductor layer, and
wherein several second electronic components corresponding to second NMOS and PMOS transistors are made in the at least one first semiconductor layer.

9. The method according to claim 1, further comprising, before making the at least one first portion of electrically conductive material, making a third semiconductor layer on the at least one first semiconductor layer, where a material of the third semiconductor layer is different from a material of the at least one first semiconductor layer, such that the at least one first dielectric layer covers the third semiconductor layer, and wherein several second electronic components corresponding to second NMOS and PMOS transistors are made such that active zones of the second NMOS transistors are made in the at least one first semiconductor layer and such that active zones of the second PMOS transistors are made in the third semiconductor layer.

10. The method according to claim 1, further comprising, between making the at least one first portion of electrically conductive material and making the at least one first electronic component, making a fourth semiconductor layer disposed between the at least one second dielectric layer and the at least one second semiconductor layer, where a material of the fourth semiconductor layer is different from a material of the at least one second semiconductor layer, and wherein several first electronic components corresponding to first NMOS and PMOS transistors are made such that active zones of the first NMOS transistors are made in the at least one second semiconductor layer and such that active zones of the first PMOS transistors are made in the fourth semiconductor layer.

11. The method according to claim 1,
wherein the at least one first semiconductor layer is a surface layer of a first SOI substrate, and
wherein a bulk layer and a buried dielectric layer of the first SOI substrate are separated from the at least one first semiconductor layer after making the at least one first electronic component and before making the at least one second electronic component.

12. The method according to claim 1, wherein the first part of the at least one electrical interconnection is made by etching at least one first hole through the at least one first dielectric layer and by filling the at least one first hole with an electrically conductive material, and then the second part of the at least one electrical interconnection is made by etching at least one second hole through at least one part of the at least one second dielectric layer and by filling the second hole with the electrically conductive material.

13. The method according to claim 12, further comprising:
after making the first part of the at least one electrical interconnection, making one or more first metallisation levels on the at least one second electronic component; and after making the second part of the at least one electrical interconnection, making one or more second metallisation levels on the at least one first electronic component.

\* \* \* \* \*